(12) United States Patent
Desai et al.

(10) Patent No.: US 6,602,770 B2
(45) Date of Patent: Aug. 5, 2003

(54) SILICON LAYER TO IMPROVE PLUG FILLING BY CVD

(75) Inventors: Sandeep A. Desai, San Jose, CA (US); Scott Brad Herner, Palo Alto, CA (US); Steve G. Ghanayem, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/981,671

(22) Filed: Oct. 16, 2001

(65) Prior Publication Data

US 2002/0090796 A1 Jul. 11, 2002

Related U.S. Application Data

(63) Continuation of application No. 09/395,040, filed on Sep. 12, 1999, now Pat. No. 6,303,480.

(51) Int. Cl.[7] .............................................. H01L 21/20
(52) U.S. Cl. ..................... 438/584; 438/584; 438/629; 438/637; 438/672; 438/675; 438/680; 438/681
(58) Field of Search ................................ 438/584, 618, 438/629, 637, 675, 672, 680–681

(56) References Cited

U.S. PATENT DOCUMENTS

| | | | | |
|---|---|---|---|---|
| 5,371,042 A | * | 12/1994 | Ong | 437/194 |
| 5,378,660 A | * | 1/1995 | Ngan et al. | 437/247 |
| 5,443,995 A | * | 8/1995 | Nulman | 437/197 |
| 5,525,543 A | * | 6/1996 | Chen | 437/190 |
| 5,527,739 A | * | 6/1996 | Parrillo et al. | 437/198 |
| 5,681,613 A | * | 10/1997 | Hansen | 427/248.1 |
| 5,741,740 A | * | 4/1998 | Jang et al. | 438/435 |
| 5,804,249 A | * | 9/1998 | Sukharev et al. | 427/99 |
| 6,001,734 A | * | 12/1999 | Drynan | 438/637 |
| 6,040,207 A | * | 3/2000 | Gardner et al. | 438/216 |
| 6,080,659 A | * | 6/2000 | Chen et al. | 438/633 |
| 6,174,795 B1 | * | 1/2001 | Shih et al. | 438/597 |
| 6,194,287 B1 | * | 2/2001 | Jang | 438/427 |
| 6,214,731 B1 | * | 4/2001 | Nogami et al. | 438/687 |
| 6,303,480 B1 | * | 10/2001 | Desai et al. | 438/584 |
| 6,350,687 B1 | * | 2/2002 | Avanzino et al. | 438/687 |
| 6,410,986 B1 | * | 6/2002 | Merchant et al. | 257/63 |

\* cited by examiner

*Primary Examiner*—Matthew Smith
*Assistant Examiner*—Granvill D Lee, Jr.
(74) *Attorney, Agent, or Firm*—Robert J. Stern

(57) ABSTRACT

A method of forming an electrically conductive plug in an opening in a dielectric layer of a substrate. Silane is thermally decomposed so as to deposit a layer of material on the walls of an opening. Subsequently, electrically conductive material is deposited so as to fill the opening.

21 Claims, 1 Drawing Sheet

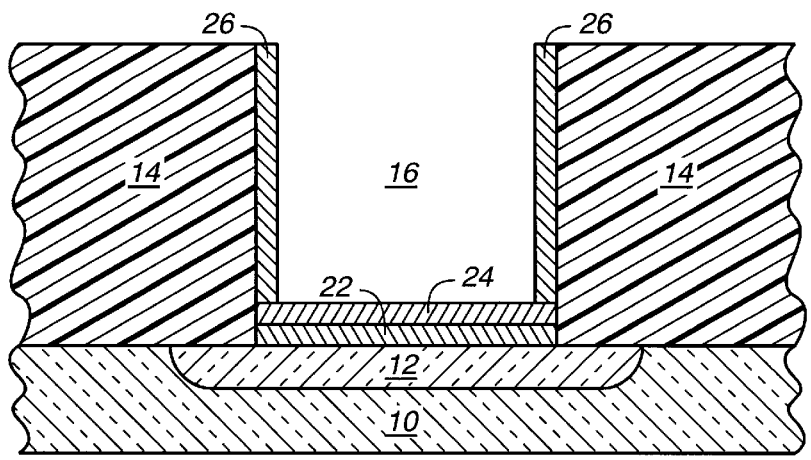
FIG._1
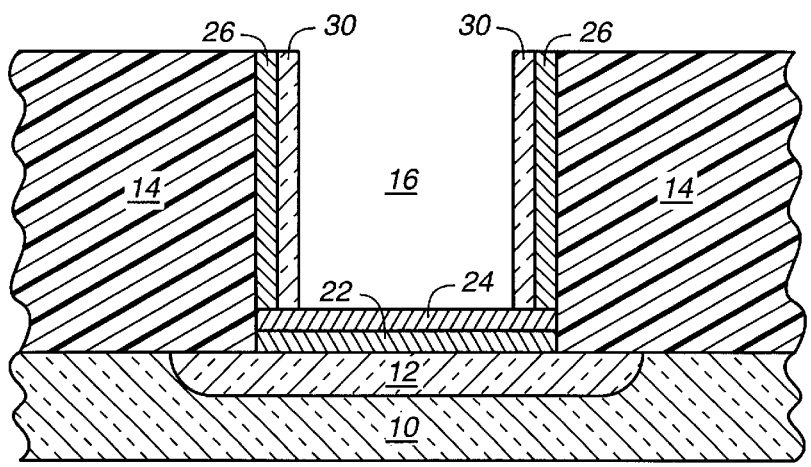
FIG._2
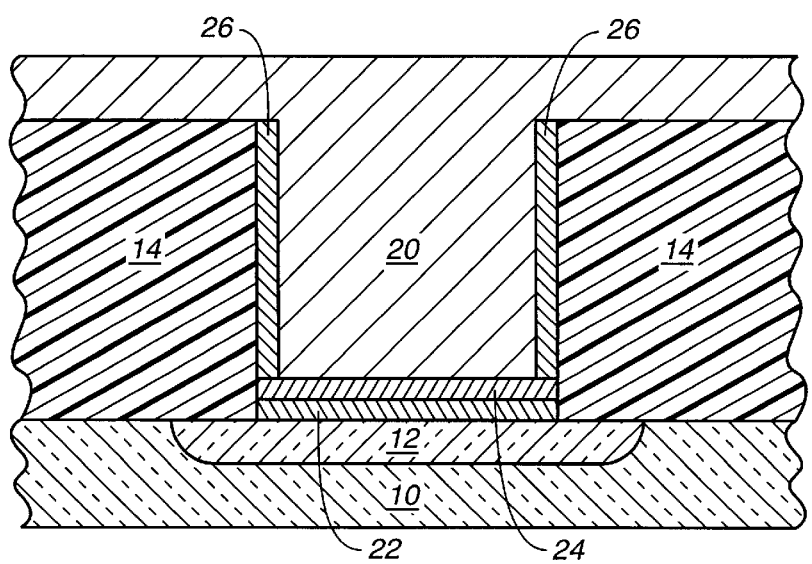
FIG._3

SILICON LAYER TO IMPROVE PLUG FILLING BY CVD

CROSS REFERENCE TO RELATED APPLICATION

This patent application is a continuation of application Ser. No. 09/395,040 filed Sep. 12, 1999, now U.S. Pat. No. 6,303,480.

FIELD OF THE INVENTION

The invention relates generally to chemical vapor deposition (CVD) processes for forming an electrically conductive plug in an electronic substrate such as an integrated circuit. More specifically, the invention relates to such a process in which a layer of silicon is deposited before filling the plug in order to increase the homogeneity of the electrically conductive material during the filling of the plug.

BACKGROUND OF THE INVENTION

A common process sequence in manufacturing integrated circuits and other electronic devices is to deposit a dielectric layer over a semiconductor or metal region on a substrate, then etch a number of openings in the dielectric so that each opening exposes a contact area on the semiconductor or metal region, then fill each opening with an electrically conductive material so as to form a plug that makes electrical contact with the contact area.

It is very difficult to fill an opening having a very narrow width or a high aspect ratio, that is, a high ratio of height to width. In such an opening, the metal or other electrically conductive material deposited to fill the opening can agglomerate while the opening is being filled, thereby preventing the metal from flowing into and filling the portion of the opening below the agglomeration. The resulting void renders the plug defective.

Conventional processes for forming a plug typically attempt to prevent the formation of voids by depositing a wetting layer or adhesion layer, typically composed of titanium nitride, on the side wall of an opening before depositing the metal used to fill the plug. However, we have found that a titanium nitride wetting layer can be inadequate to prevent the formation of voids in openings having a high aspect ratio, for example, an aspect ratio of 6 or more. This is especially true of titanium nitride layers formed by CVD using a metallo-organic precursor gas, which is a preferred method of depositing titanium nitride when the substrate temperature must remain low.

Even if a narrow opening is completely filled without voids, the plug may have undesirably high resistivity because the crystallographic structure of the conductive material of the plug may include a large number of small grains rather than a small number of large grains. A large number of grain boundaries within the plug increases its electrical resistance.

SUMMARY OF THE INVENTION

The invention is a method of forming an electrically conductive plug in which a first layer of material is deposited on the walls of an opening before the opening is filled with electrically conductive material. The first layer is deposited by thermal decomposition of silane ($SiH_4$). We have discovered that the silane decomposition step improves the homogeneity of the electrically conductive material subsequently deposited to fill the plug. The resulting plug material typically has larger grains, and higher aspect ratio openings typically can be filled without voids.

BRIEF DESCRIPTION OF THE DRAWINGS

FIG. 1 is a schematic sectional view of an opening in a dielectric layer of a substrate.

FIG. 2 is a schematic sectional view of an opening having a barrier/wetting layer over which a layer of silicon has been deposited according to the present invention.

FIG. 3 is a schematic sectional view of a plug formed according to the present invention.

DETAILED DESCRIPTION OF THE PREFERRED EMBODIMENTS

Conventional Plug

FIG. 1 shows a conventional semiconductor workpiece or substrate 10 on which the processes of the invention can be performed. The substrate typically is a silicon wafer on which integrated circuits are to be formed, or a glass substrate on which electronic video display devices and circuits are to be formed. For convenience, we use the term "semiconductor substrate" to refer to any such substrate. In all of the following examples, the substrate is depicted as a silicon wafer.

The substrate includes one or more regions 12 of semiconductor or conductor material. A dielectric layer 14 overlies the semiconductor or metal regions. The dielectric 14 is patterned with a number of openings 16 so that each opening exposes an area of one of the semiconductor or metal regions 12, this area being termed the "contact area" or "exposed area" of the semiconductor or metal region. (We define all portions of the semiconductor or metal regions 12 that are not covered by the dielectric 14 as being "exposed" even though the exposed surface may be covered by thin layer of native oxide as a result of exposure of the metal to oxygen, such as oxygen in the ambient atmosphere.)

As shown in FIG. 3, each opening 16 is filled with a metal or other conductive material 20 to form a "plug" that makes electrical contact with the underlying semiconductor or metal region 12. The plug also is called either a "contact" or a "via" according to whether the underlying region 12 is a semiconductor region or a metal interconnect, respectively.

When the region 12 underlying the plug 20 is a semiconductor material, often a contact layer 22 is deposited directly over the semiconductor region. The contact layer is composed of a metal whose atoms do not substantially diffuse into the semiconductor 12, but into which a small amount of the semiconductor material diffuses to form a good electrical contact. For example, when the underlying region 12 is silicon, a titanium contact layer 22 typically is deposited over the silicon. Subsequent annealing causes silicon to diffuse into the titanium to form titanium silicide.

A diffusion barrier layer 24 typically is deposited over the contact layer before depositing the plug material 20. The barrier layer 24 prevents metal atoms of the plug material from diffusing into and contaminating the semiconductor 12. The most commonly used material for the diffusion barrier is titanium nitride.

To minimize agglomeration of the plug material 20 while it is being deposited in the opening, the side wall of each opening typically is covered with a wetting or adhesion layer 26 composed of a material having high adhesion to the plug material. When the plug material is tungsten or aluminum, typical materials used for the wetting/adhesion layer are titanium or a compound of titanium such as titanium nitride, titanium tungsten, or titanium silicide.

Because titanium nitride has both barrier properties and wetting properties, a single layer of titanium nitride can be deposited to function as both the barrier layer 24 and the wetting layer 26.

Finally, the remainder of the opening is filled with a conductive material 20, such as tungsten or aluminum, to form the plug.

The workpiece 10 shown in FIG. 1 and the just described process steps for forming the described openings and layers are all conventional. Each layer 20–26 typically is deposited either by a sputter deposition process or by a chemical vapor deposition process performed in a conventional process chamber used for fabricating semiconductor or electronic substrates. These structures and processes are described in the following commonly-assigned U.S. patents, the content of each of which is hereby incorporated by reference into the present patent specification: U.S. Pat. No. 5,108,569 to Gilboa; U.S. Pat. No. 5,371,042 to Ong; U.S. Pat. No. 5,378,660 to Ngan; U.S. Pat. No. 5,443,995 to Nulman; U.S. Pat. No. 5,525,543 to Chen; U.S. Pat. No. 5,911,113 to Yao; and U.S. Pat. No. 5,943,600 to Ngan.

Metal CVD over Silicon Layer

As stated above in the Background of the Invention, when the opening 16 has a very high aspect ratio, it is difficult to deposit the metal or other conductive material 20 so as to fill the opening without forming voids, even when the side wall of the opening is covered with a titanium nitride adhesion layer 26.

We found that void-free plugs were especially difficult to form when the titanium nitride was deposited by a metalloorganic chemical vapor deposition (MOCVD) process, i.e., deposition by decomposition of a titanium-containing organic compound. Conventional MOCVD processes for depositing titanium nitride are described in U.S. Pat. No. 5,723,382 to Sandhu et al.; U.S. Pat. No. 5,246,881 to Sandhu et al.; and in the above-referenced U.S. Pat. No. 5,943,600 to Ngan, the entire content of each of which is hereby incorporated by reference into the present patent specification.

MOCVD processes often are desirable for depositing the titanium nitride because they can be performed at a lower substrate temperature than processes using an inorganic titanium precursor gas such as $TiCl_4$. Also, compared to sputter deposition, MOCVD typically provides more uniform side wall coverage of high aspect ratio openings. However, titanium nitride films produced by MOCVD often have a high content of oxygen, carbon, and possibly other constituents of the organic process gases used in the MOCVD process, and we believe that such impurities in the titanium nitride can impede nucleation of metal film deposited in a subsequent metal CVD process. For example, we observed voids when attempting to employ a conventional tungsten CVD process to fill openings having an aspect ratio of 6, where the sides and bottoms of the openings were covered with titanium nitride deposited by MOCVD.

We discovered that such openings could be successfully filled without voids by depositing a layer of silicon 30 over the titanium nitride barrier layer 24 and wetting/adhesion layer 26 as shown in FIG. 2, and then filling the opening with conductive material 20 by conventional CVD. We discovered that the silicon layer promotes the formation of a continuous nucleation layer rather than discrete "islands" of isolated nucleation sites during initial deposition of the conductive material, which results in the deposition of a continuous, smooth, homogeneous layer of the conductive material that appears to have very few grain boundaries.

One advantage of our process is that the conductive material deposits in a continuous film over the side wall of the opening, thereby avoiding agglomeration of the conductive material that can produce voids in the plug. A second advantage of our process is that it can produce a plug having lower electrical resistance, this lower resistance probably being due to the plug material having fewer grain boundaries. A third advantage is that the formation of a continuous initial nucleation layer results in the barrier layer 24 being covered by the conductive material more quickly than if the initial deposition occurred in islands of isolated nucleation sites. Consequently, the barrier layer will be exposed to process gas constituents such as fluorine for a shorter time, which may permit the use of a thinner barrier layer.

The chemical vapor deposition (CVD) process used to deposit the metal or other conductive material 20 over the silicon layer 30 can be any CVD process that includes a precursor gas that can react with the silicon layer 30 to deposit the conductive material onto the walls of the openings 16. In other words, the precursor gas can be any compound of a metal (or other conductive material) and a second constituent that reacts with silicon. Preferably, the second constituent should react with silicon to form a volatile compound that can be readily evacuated from the process chamber.

Although our invention is not limited by any theory of operation, we believe the process of our invention operates as follows. The metal-containing precursor gas reacts with the silicon atoms in layer 30 so that atoms of metal from the precursor material replace the silicon atoms on the walls of the opening. In effect, the silicon layer 30 functions as a template for deposition of the metal atoms from the precursor gas. This creates a continuous, smooth, homogeneous initial nucleation layer of metal over which the remainder of the metal 20 is deposited to fill the plug.

Our preferred process for depositing the silicon, described in detail below, deposits a layer of silicon 30 that is only one atomic layer deep. Consequently, we expect all of the silicon 30 to be consumed as the initial atomic layer of metal 20 is deposited over the silicon, so that no silicon layer remains in the completely filled plug shown in FIG. 3.

For example, a conventional CVD process for filling an opening with tungsten 20 uses a process gas mixture containing tungsten hexafluoride ($WF_6$) gas and silane ($SiH_4$) gas. The $WF_6$ functions as a tungsten-containing precursor, and the $SiH_4$ reacts with the $WF_6$ to produce tungsten atoms and $SiF_4$ gas. If such a conventional process gas mixture is dispensed over a substrate containing openings in which a layer 30 of silicon has been deposited in accordance with our invention, the $WF_6$ will react with the silicon atoms in layer 30 to produce tungsten atoms and $SiF_4$ gas. Each tungsten atom will replace a silicon atom on the walls of the openings, and the $SiF_4$ will be evacuated by the exhaust pump of the process chamber. After an initial atomic layer of tungsten is deposited in place of the silicon layer, tungsten deposition will continue by reaction between the $WF_6$ and $SiH_4$ in the process gas mixture, as in a conventional tungsten CVD process.

Although our process has been described as especially useful for filling openings having bottom and side walls covered by titanium nitride deposited by MOCVD, our process is not so limited. We also have successfully employed our process to fill openings having bottom and side walls covered by titanium nitride 24, 26 deposited by reactive sputter deposition. Furthermore, we expect our process also would be useful for filling openings having barrier layers or adhesion/wetting layers composed of materials other than titanium nitride, or even openings not having any barrier layer or adhesion layer. In all of these cases, we expect depositing a silicon layer 30 before performing chemical vapor deposition of the conductive material 20 to fill the opening will improve the homogeneity of the conductive material so as to prevent the formation of voids in the plug and reduce the number of grain boundaries in the material.

If a practitioner wanted to obtain the benefit of continuous deposition on the side wall of an opening for the primary purpose of preventing the formation of voids, and if that practitioner were willing to forgo some of the benefit of improved grain structure, then it would suffice to cover the side wall of the opening with the silicon layer 30 without necessarily covering the bottom of the opening.

EXAMPLES

We demonstrated the benefits of depositing a single atomic layer of silicon prior to tungsten CVD as follows. We examined test wafers with a scanning electron microscope to observe the nucleation sites as the tungsten CVD process progressed. We tested flat wafers rather than patterned wafers, but we expect that the conditions that will improve nucleation of tungsten on a flat surface also will improve nucleation on the side and bottom walls of a narrow opening.

To simulate a surface chemistry identical to that which typically would be found on the bottom or side wall of a opening for a plug, we formed the following successive layers on a 200 mm silicon wafer: (1) We grew a 3000 Å layer of silicon oxide by annealing the silicon wafer in an oxygen atmosphere at a wafer temperature of 1000° C.; (2) We deposited 200 to 300 Å of titanium by ionized metal plasma sputter deposition; (3) We deposited 100 Å of titanium nitride by an MOCVD process employing thermal decomposition of tetrakis (dimethylamide) titanium (TDMAT); (4) Some of the wafers then were exposed to a plasma to drive out the oxygen, carbon and other impurities from the titanium nitride and to densify the titanium nitride; (5) One some of the wafers we deposited a single atomic layer of silicon by thermal decomposition of silane, using the silicon deposition process described below; then (6) We deposited tungsten in a thermal CVD process performed at a chamber pressure of 30 Torr, with a gas mixture of the following gases and flow rates: $WF_6$ at 30 sccm, $SiH_4$ at 30 sccm, Ar at 2500 sccm, and $H_2$ at 1000 sccm.

With the wafers for which we did not perform the plasma treatment step (4), the advantages of the invention were especially marked. With the wafers on which we deposited the silicon layer in step (5), the scanning electron microscope photos revealed homogeneous nucleation of the tungsten after only 4 seconds of tungsten deposition time. In contrast, with the wafers on which we skipped step (5) so as to not deposit the silicon layer, even after 7 seconds the deposited tungsten had not coalesced. Instead, at 7 seconds we observed islands of tungsten nucleation, each island being about 0.14 microns in diameter. After 10 seconds, by which time the tungsten layer was 400 Å thick, the tungsten film finally coalesced into a continuous film.

After 15 seconds of tungsten deposition we measured the resistivity of the tungsten film. The resistivity was about twice as high for the tungsten that was deposited directly over the titanium nitride as compared to the tungsten that was deposited over a mono-atomic layer of silicon. We believe this difference is largely due to our process producing a tungsten film having fewer grain boundaries.

With the wafers for which we did perform the plasma treatment step (4), the difference between tungsten films deposited with and without the silicon layer was less dramatic. However, the scanning electron microscope photos showed evident grains without the silicon layer, whereas the film was smooth with no evident grains when the silicon was deposited according to our invention.

Silicon Deposition Process

Our preferred process for depositing the silicon layer 30 is thermal decomposition of silane. The temperature of the substrate 10 is elevated sufficient to promote decomposition of the silane, and the substrate is exposed to an atmosphere containing silane ($SiH_4$) gas for a period of time sufficient to deposit a single atomic layer of silicon on the bottom and side wall of the opening. We successfully tested this process in a conventional vacuum chamber, also called a process chamber, used for conventional thermal CVD processes.

We tested a range of process conditions to determine what conditions would reliably deposit the desired uniform monoatomic layer of silicon. For purposes of this series of tests, we used the flat test wafers described above rather than patterned substrates, because we expect that the conditions that will successfully deposit a mono-atomic layer of silicon on the bottom and side walls of openings are about the same as those that we found would deposit such a layer on a flat surface.

With the test wafers just described, we attempted to deposit a mono-atomic layer of silicon by thermal decomposition of silane. We mounted the substrate on a pedestal whose temperature was maintained at 425° C., so that the substrate temperature was about 410° C.

The gas mixture we supplied to the chamber consisted of silane gas diluted by argon gas. We tested chamber pressures of 30, 90 and 300 Torr; silane flow rates of 30, 60, 75 and 90 sccm; and argon flow rates of 1300 and 2500 sccm. We found that the silicon deposition process was self-limiting, so that so after an initial mono-atomic layer was deposited, no additional silicon was deposited on the substrate. We found that a silane flow rate of at least 60 sccm reliably deposited a mono-atomic layer of silicon over the MOCVD titanium nitride, independent of the chamber pressure and the argon flow rate. Flow rates of at least 75 sccm and 90 sccm would be progressively more preferable. The time required to deposit the silicon layer typically was 10 seconds, and never required more than 60 seconds.

Conversely, we could not consistently deposit a mono-atomic layer of silicon with a silane flow rate of only 30 sccm, even when we reduced the argon flow rate to 1300 sccm and increased the chamber pressure to 300 Torr so that the silane partial pressure was 6.8 Torr. In contrast, one of the successful tests involved a silane flow rate of 75 sccm, an argon flow rate of 2500 sccm, and a chamber pressure of 90 Torr, so that the silane partial pressure was only 2.6 Torr. This suggests that a sufficient silane flow rate is much more important than a sufficient silane partial pressure in determining whether a mono-atomic layer of silicon can be reliably deposited.

We expect that the required silane flow rate will increase in direct proportion to the surface area of the substrate to be treated. For example, if a 400 mm substrate were to be treated instead of the 200 mm substrate used in the above tests, the substrate surface area would be four times greater, so we expect the silane flow rate should be increased by a factor of four to at least 240 sccm.

Throughout this patent specification, we use directional terms such as top, bottom, up, and down merely to mean direction relative to the surface of a substrate or the mouth of an opening. These terms are not intended to imply any orientation relative to the direction of the earth's gravity.

What is claimed is:

1. A method of forming an electrically conductive plug in an opening in a substrate, comprising the sequential steps of:

providing a substrate having a layer of dielectric that includes an opening laterally bounded by a side wall;

thermally decomposing silane so as to deposit a layer of material on the side wall of the opening; and depositing electrically conductive material so as to fill the opening.

2. The method of claim 1, wherein the step of thermally decomposing silane further comprises:

maintaining the substrate at a temperature high enough to thermally decompose said silane.

3. The method of claim 1, wherein:

(a) the substrate is characterized by a surface area; and (b) the step of thermally decomposing silane comprises the simultaneous steps of:

(i) holding the substrate within a vacuum chamber, and (ii) supplying silane to the vacuum chamber at a flow rate of at least 60 sccm multiplied by the ratio of the surface area of the substrate to the area of a circle having a diameter of 200 mm.

4. The method of claim 3, wherein the supplying step further comprises:

maintaining in the vacuum chamber a pressure of at least 30 torr.

5. A method according to claim 3, wherein the step of supplying silane to the vacuum chamber further comprises supplying argon to the vacuum chamber.

6. A method according to claim 3, wherein the step of supplying silane to the vacuum chamber further comprises supplying argon to the vacuum chamber at a flow rate of at least 1300 sccm.

7. The method of claim 1, wherein the step of depositing electrically conductive material comprises depositing said electrically conductive material by chemical vapor deposition.

8. A method according to claim 1, wherein the step of depositing electrically conductive material comprises:

depositing a metal by chemical vapor deposition using a precursor gas having a first constituent that is said metal and having a second constituent that reacts with silicon to form a volatile byproduct.

9. A method according to claim 8, wherein the step of depositing a metal further comprises the steps of:

positioning the substrate within a vacuum chamber; and evacuating said volatile byproduct from the vacuum chamber.

10. The method according to claim 1, wherein the step of depositing electrically conductive material comprises:

depositing tungsten by chemical vapor deposition using a precursor gas that includes tungsten hexafluoride.

11. A method according to claim 1, wherein the electrically conductive material is tungsten.

12. The method according to claim 1, further comprising the step of:

covering the side wall of the opening with a layer of titanium nitride before the step of thermally decomposing silane.

13. A method according to claim 12, wherein the step of covering the side wall with a layer of titanium nitride comprises:

depositing said layer of titanium nitride by metallo-organic chemical vapor deposition.

14. A method according to claim 1, wherein the step of thermally decomposing silane is performed for a duration of time in the range of 10 to 60 seconds.

15. A method according to claim 1, wherein:

(a) the substrate is characterized by a surface area; and (b) the step of thermally decomposing silane comprises the simultaneous steps of:

(i) holding the substrate within a vacuum chamber, and (ii) supplying silane to the vacuum chamber at a flow rate of at least 90 sccm multiplied by the ratio of the surface area of the substrate to the area of a circle having a diameter of 200 mm.

16. A method according to claim 1, wherein the step of thermally decomposing silane further comprises:

maintaining the substrate at a temperature of about 410° C. throughout the step of thermally decomposing silane.

17. A method according to claim 1, wherein the step of thermally decomposing silane further comprises the steps of:

mounting the substrate on a pedestal; and maintaining the pedestal at a temperature of about 425° C. during the thermal decomposition of the silane.

18. A method according to claim 1, wherein the step of depositing electrically conductive material comprises:

depositing tungsten by chemical vapor deposition using a precursor gas mixture that includes tungsten hexafluoride and silane.

19. A method according to claim 18, wherein the precursor gas mixture further includes argon.

20. A method according to claim 18, wherein the precursor gas mixture further includes hydrogen gas.

21. A method of forming an electrically conductive plug in an opening in a substrate, comprising the sequential steps of:

providing a substrate having a layer of dielectric that includes an opening laterally bounded by a side wall;

thermally decomposing silane so as to deposit a layer of material covering the side wall of the opening; and depositing electrically conductive material so as to fill the opening.

* * * * *